(12) United States Patent
Wadland et al.

(10) Patent No.: US 8,510,703 B1
(45) Date of Patent: Aug. 13, 2013

(54) METHOD AND MECHANISM FOR IMPLEMENTING PCB ROUTING

(75) Inventors: Ken Wadland, Grafton, MA (US); Richard Allen Woodward, Jr., San Diego, CA (US); Randall Lawson, Westford, MA (US); Alan G Strelzoff, Boxford, MA (US); David Tsai, Windham, NH (US); Steve Russo, Holden, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 346 days.

(21) Appl. No.: 11/098,039

(22) Filed: Apr. 1, 2005

(51) Int. Cl.
*G06F 17/50* (2006.01)

(52) U.S. Cl.
USPC ............................... 716/129; 716/131

(58) Field of Classification Search
USPC .............. 716/1–18, 126, 129, 130, 131
See application file for complete search history.

(56) References Cited

U.S. PATENT DOCUMENTS

| | | | | |
|---|---|---|---|---|
| 5,315,535 A * | 5/1994 | Kikuchi et al. | | 716/15 |
| 5,532,934 A * | 7/1996 | Rostoker | | 716/10 |
| 5,583,788 A * | 12/1996 | Kuribayashi | | 716/14 |
| 5,617,322 A * | 4/1997 | Yokota | | 700/98 |
| 5,636,129 A * | 6/1997 | Her | | 716/12 |
| 5,822,214 A * | 10/1998 | Rostoker et al. | | 716/10 |
| 5,946,479 A * | 8/1999 | Sakaguchi et al. | | 716/20 |
| 5,987,086 A * | 11/1999 | Raman et al. | | 716/1 |
| 6,006,024 A * | 12/1999 | Guruswamy et al. | | 716/12 |
| 6,035,108 A * | 3/2000 | Kikuchi | | 716/2 |
| 6,088,254 A * | 7/2000 | Kermani | | 365/63 |
| 6,209,123 B1 * | 3/2001 | Maziasz et al. | | 716/14 |
| 6,230,304 B1 * | 5/2001 | Groeneveld et al. | | 716/113 |
| 6,353,801 B1 * | 3/2002 | Sercu et al. | | 702/65 |
| 6,480,991 B1 * | 11/2002 | Cho et al. | | 716/8 |
| 6,516,447 B2 | 2/2003 | Wadland et al. | | |
| 6,516,455 B1 * | 2/2003 | Teig et al. | | 716/7 |
| 6,546,540 B1 * | 4/2003 | Igarashi et al. | | 716/13 |
| 6,629,309 B1 * | 9/2003 | Allen, III | | 716/16 |
| 6,651,233 B2 * | 11/2003 | Teig et al. | | 716/7 |
| 6,714,903 B1 * | 3/2004 | Chu et al. | | 703/19 |
| 6,732,351 B2 * | 5/2004 | Yamashita | | 716/19 |
| 6,813,756 B2 * | 11/2004 | Igarashi et al. | | 716/14 |
| 6,845,492 B1 * | 1/2005 | Frank et al. | | 716/2 |
| 6,886,149 B1 * | 4/2005 | Teig et al. | | 716/12 |
| 6,889,372 B1 * | 5/2005 | Teig et al. | | 716/14 |

(Continued)

OTHER PUBLICATIONS

Koh, Cheng-Kok et al., "Manhattan or Non-Manhattan?—A Study of Alternative VLSI Routing Architectures", Apr. 1999, Purdue University School of Electrical and Computer Engineering, ECE Technical Reports—Purdue Libraries 1999, pp. 1-13.*

(Continued)

*Primary Examiner* — Vuthe Siek
*Assistant Examiner* — Aric Lin
(74) *Attorney, Agent, or Firm* — Vista IP Law Group, LLP

(57) ABSTRACT

A method and system for auto-routing wiring within a PCB. In some embodiment, a first broad region within a first layer and a counterpart first broad region within a second layer are defined. The counterpart regions define a first broad via location. In some embodiments, the first and second broad via locations of the first and second layers can then be subdivided into a plurality of triangular regions. The triangular regions on the first and second layers can then be compared to more accurately locate an appropriate via location.

42 Claims, 10 Drawing Sheets

(56) References Cited

U.S. PATENT DOCUMENTS

| | | | |
|---|---|---|---|
| 6,898,773 B1* | 5/2005 | Teig et al. | 716/13 |
| 6,931,608 B1* | 8/2005 | Teig et al. | 716/4 |
| 6,931,615 B1* | 8/2005 | Teig et al. | 716/12 |
| 6,944,841 B1* | 9/2005 | Teig et al. | 716/12 |
| 6,948,144 B1* | 9/2005 | Teig et al. | 716/12 |
| 6,957,408 B1* | 10/2005 | Teig et al. | 716/12 |
| 6,973,634 B1* | 12/2005 | Teig et al. | 716/13 |
| 6,976,233 B1* | 12/2005 | Frank et al. | 716/4 |
| 6,983,434 B1* | 1/2006 | Frank et al. | 716/5 |
| 7,045,801 B2* | 5/2006 | Nakasugi | 250/492.22 |
| 7,051,298 B1* | 5/2006 | Teig et al. | 716/4 |
| 7,069,531 B1* | 6/2006 | Teig et al. | 716/12 |
| 7,073,151 B1* | 7/2006 | Teig et al. | 716/12 |
| 7,089,524 B1* | 8/2006 | Teig et al. | 716/12 |
| 7,096,448 B2* | 8/2006 | Teig et al. | 716/12 |
| 7,114,141 B1* | 9/2006 | Teig et al. | 716/12 |
| 7,117,468 B1* | 10/2006 | Teig et al. | 716/11 |
| 7,155,698 B1* | 12/2006 | Gennari | 716/19 |
| 7,246,338 B1* | 7/2007 | Teig et al. | 716/12 |
| 2002/0178429 A1* | 11/2002 | Nakayama et al. | 716/15 |
| 2006/0242614 A1 | 10/2006 | Wadland et al. | |

OTHER PUBLICATIONS

Das, Sandip et al., "Channel Routing in Manhattan-Diagonal Model", Jan. 1996, $9^{th}$ International Conference on VLSI Design, pp. 43-48.*

Dai, W. "Topological Routing in SURF: Generating a Rubber-Band Sketch" Proceedings of the 28th Conference on ACM/IEEE Design Automation, San Francisco, CA, 1991, pp. 39-44.

Dai, W. "Routability of a Rubber-Band Sketch" Proceedings of the 28th Conference on ACM/IEEE Design Automation, San Francisco, CA, 1991, pp. 45-48.

* cited by examiner

METHOD AND MECHANISM FOR IMPLEMENTING PCB ROUTING

BACKGROUND

Global routing has long been a requirement in the Integrated Circuit (IC) realm. Without global routing, the immense number of connections in a modern IC would make it nearly impossible to auto-route an IC in a reasonable amount of time. However, no one has ever successfully created a global routing solution for Printed Circuit Board (PCB) technology.

The most limiting aspect of an auto-routing system is its representation of routing space. In current systems, routing space is represented as a collection of interconnected regions. These regions can be either the objects to avoid or the areas still available for routing or both. The representation of the routing space selected also defines and limits the ability of the router to find via locations.

Historically, the earliest auto-routers represented the entire routing area using squares. Some of the squares were marked as "used"; the others were marked as "available". These auto-routing systems used a fixed routing grid, making each of these squares the same size. This made finding potential via locations relatively simple since the corresponding location on another layer was on the corresponding location in the other layer's array of squares.

Use of squares resulted in much of the space being unusable, because not all the features on a circuit have the same width. Over time, many variations were developed to allow the areas to be modified to arrays of rectangles. This was accomplished using several different techniques, including varying the grid over a region and repeating a pattern of grids, among others. Mapping a location from one layer to another was slightly more complicated, but still mathematically simple. As simple as it may seem, moving from using an array of squares to using an array of rectangles was a significant advance in auto-routing. Using an array of rectangles maintained the processing speed possible with using squares, but allowed more usable space in the system. In the IC realm, variations on this process are still the norm.

As PCB devices began to use more closely spaced components and as surface mount devices became more common, it became impossible to find a grid or any variation on a grid that would allow the system to work. Newer auto-routing systems are "gridless". That is, the rectangles which the system defines can be any size. A rectangle no longer needed to be the same size as its neighbors. It no longer needed to have exactly four neighbors (north, south, east and west). However in these systems, routing space is still represented by rectangles.

Finding potential via locations with arbitrary rectangles in such systems is now much more complicated, since it is not trivial to determine which rectangles on one layer overlap with which rectangles on another layer. The intersection of any two rectangles has three possibilities: 1) the intersection can be a rectangle, 2) the two rectangles might touch (at a point or a line segment) but not overlap, or 3) they do not intersect at all. Storing the rectangles in a searchable database (such as a quad-tree or sector-map) make it possible to develop algorithms to make this calculation speed acceptable.

Modernly, a few auto-routing systems have used "octolinear octagons." That is, an 8-sided polygon whose sides are at 0, 45, 90, 135, 180, 225, 270 and 315 degrees. This has the advantage that it represents 45-degree routing well and can be stored compactly. And, a rectangle can be considered as a degenerate octolinear octagon. That is, the four diagonal sides of the octolinear octagon have zero length.

The intersection of two arbitrary octagons can be a very complex shape. But, the intersection of two octolinear octagons is always an octolinear octagon, possibly degenerate with one or more zero length sides. There are mathematical optimizations existing that allow this computation to be reasonably efficient.

The only other object shape to have been tried in an autorouter is a triangle. Using triangles has the obvious advantage that any shape can be approximated with triangles. However, it has a severe disadvantage in that the intersection of two triangles is not necessarily a triangle. In fact, the intersection can be a 3, 4, 5, or 6 sided polygon.

An IC router uses global information to create routing at the next lower level; it normally will insert vias to resolve crossovers. In PCB routing, this is not practical. The radius of a PCB via is usually much larger than wires; it often penetrates many layers. And, in many cases, signal integrity requirements severely limit the numbers of vias on a net. So, in PCB, insertion of a via is a very "expensive" operation that must be used very sparingly if a complete solution is to be reached. Adding two vias to resolve a single crossover is almost never acceptable. As a result, traditional methods have been unable to use global information for detail routing on a PCB.

To date, every PCB auto-routing system that has ever attempted to use triangles for its representation of space has encountered problems finding via locations. What is needed is an auto-routing system and method that can efficiently and effectively utilize triangular space representations.

SUMMARY

What is described is a way to represent a routing area that can utilize triangular shaped routing space representations and permits via creation systems to operate at a global level prior to construction of detail wires. The system and method uses a representation of routing space to allow global selection of via locations on this representation prior to the creation of detail wires.

This representation comprises dividing the routable area into rectangles and then subdividing these rectangles into triangles. The rectangular representation allows approximate via locations to be computed (which are referred to as "first order via locations"). The system can then employ more sophisticated methods to compute a more accurate via location (which are referred to as "2nd order via locations"). The $2^{nd}$ order via locations are topologically correct, but may not be geometrically correct. Additional methods can then be employed to accurately reflect appropriate geometry for the vias.

BRIEF DESCRIPTION OF THE DRAWINGS

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
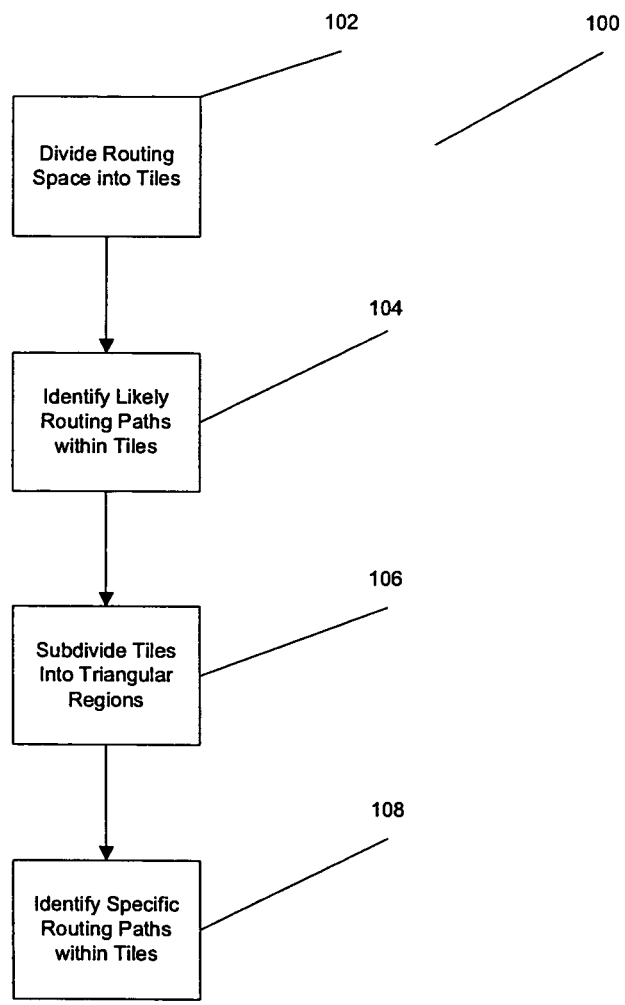
FIG. 1 depicts a high-level flow diagram for PCB routing.

FIG. 1 depicts a high level flow chart 100 of a method of PCB routing. In step 102 the routing space is divided into rectangular tile areas. The process of dividing the routing space into rectangular tile areas can be performed in any known and/or convenient manner using any known and/or convenient system. In some embodiments, the rectangular tile area can be uniform and in alternate embodiments the rectangular tile area may not be uniform.

In step 104, the system identifies likely routing paths across the routing space. The likely routing paths across the routing space can be performed in any known and/or convenient manner.

In step 106, the system subdivides the tile areas into triangular regions. The triangular regions can be established using any known and/or convenient method or system.

In step 108, detailed routing is performed to identify specific routing paths across the routing space, based on the triangular regions. The detailed routing can be performed using any known and/or convenient system or method.

Figure 2:
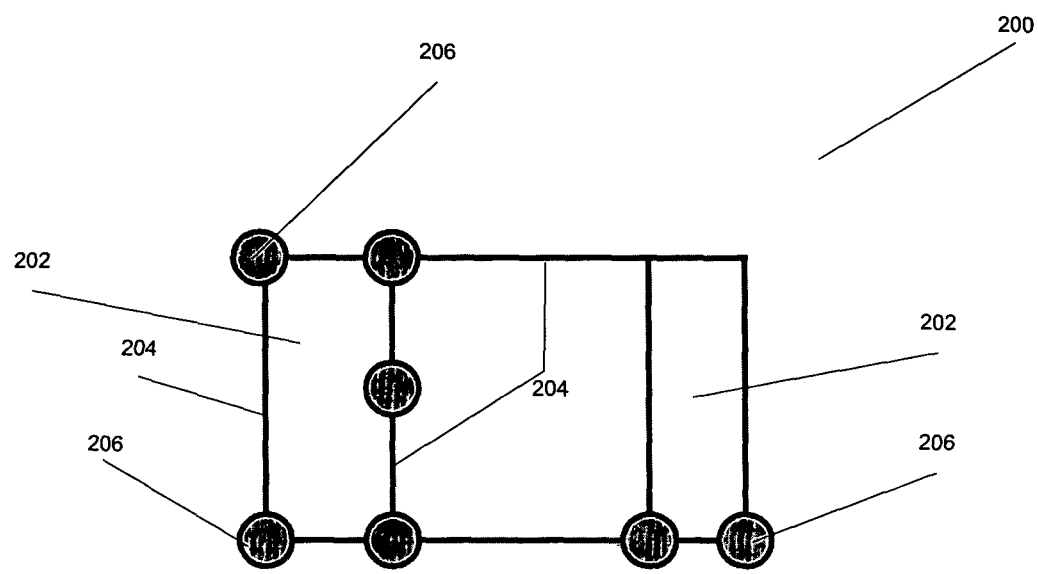
FIG. 2 depicts a routing space divided into rectangular tiles.

FIG. 2. Prior to beginning auto-routing, the entire routing space is divided into rectangular areas. FIG. 2 depicts, a segment of a routing space 200 divided into several rectangular areas, referred to as tiles 202. The process of creating tiles is referred to as tiling. Each tile includes edges 204 at its perimeter and corners 206. In some embodiments, the corners 206 of the tiles 202 are made to fall on non-movable objects within the routing space 200. In some embodiments the non-movable objects can be pins of large components, or on the corners of other routing obstacles, such as large keep-out areas or any other known or convenient non-movable object. In alternate embodiments, the corners can be located at any convenient locations within the routing space 200.

Figure 3:
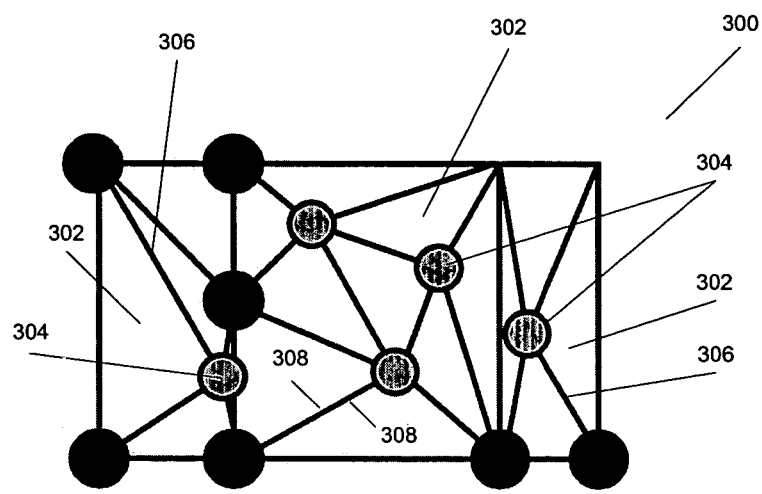
FIG. 3 depicts the routing space of FIG. 2 further divided into triangular areas.

FIG. 3 depicts the tiles shown in FIG. 2, further subdivided into triangles 302. This process can be performed using variations of methods well known in the art, called "Delaunay Triangulation" Each of the vertices of these triangles is referred to as a node 304 and the sides of the triangles are referred to as cuts 306. A cut 306 is always on the boundary between exactly two triangles 302. Each side of a cut 306 is referred to as a face 308. A cut 306 that falls along the outer boundary of a tile 302 can also be referred to as an edge.

In some embodiments, the locations of nodes 304 can be based on the locations of vias, pads or any other object on the tile 202. However, in alternate embodiments, locations can be selected in any convenient location on the tile 202. Nodes 304 which do not coincide with an object on the tile 302 are referred to as null nodes. Null nodes can be introduced to control relative dimensions of the triangles 302. Each cut 306 has attributes, such as the total available routing space in the cut 306 and the current occupancy of the cut 306 which can be caused by wires or other objects intersecting the cut 306.

Figure 4:
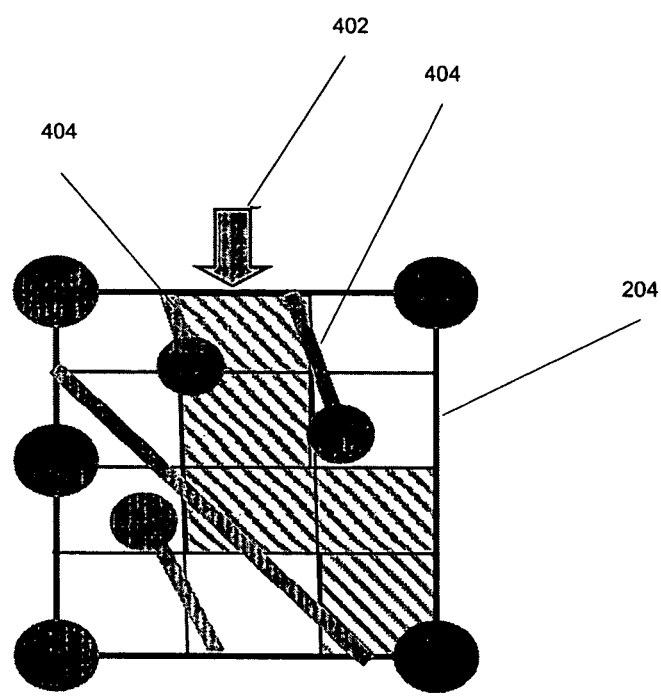
FIG. 4 depicts an exemplary channel within a rectangular tile on a first layer
Figure 5:
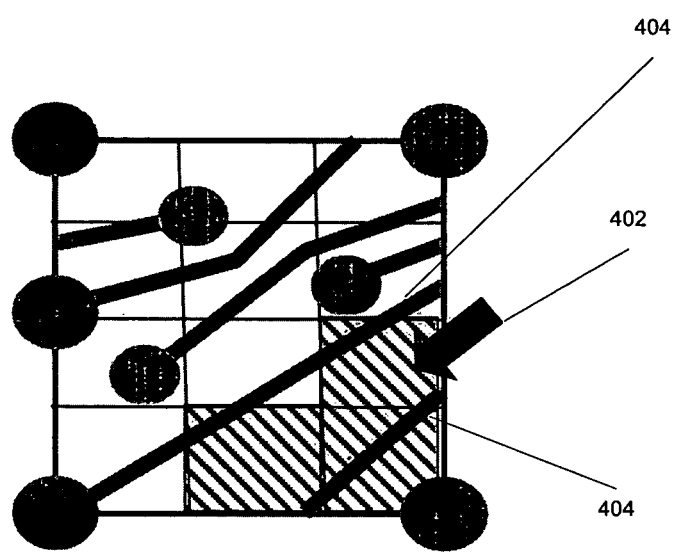
FIG. 5 depicts an exemplary channel within a rectangular tile on a second layer.

Referring to FIGS. 4 and 5. A channel 402 is defined as the space between two wires 404 at the area where they cross an edge 204. In some embodiments, each of the edges 204 can be pre-processed to determine the possibility of running a wire 404 from channels 402 in examined edge 204 to various locations within its neighboring tile 202 or on another layer 406. In some embodiments, for each channel 402 of each edge 204, pre-processing can be used to define a data value describing the viability of reaching each of the defined locations within a tile 204. In some embodiments, the data value can be a 32-bit compressed data value. In alternate embodiments, the data value can be any convenient data value. The data value is referred to as channel data FIG. 5 depicts a second tile 202 on a second layer which corresponds to the first tile 202 on the first layer of the PCB. In some embodiments, each of the edges 204 can be pre-processed to determine the possibility of running a wire 404 from channels 402 in examined edge 204 to various locations within its neighboring tile 202 on another layer 406. In some embodiments, for each channel 402 of each edge 204, pre-processing can be used to define a data value describing the viability of reaching each of the defined locations within a tile 204. In some embodiments, the data value can be a 32-bit compressed data value. In alternate embodiments, the data value can be any convenient data value. This data value is also referred to as channel data In FIGS. 4 and 5, the shaded areas represent segments within the tile that have been identified as possible via locations within the tile.

Figure 6:
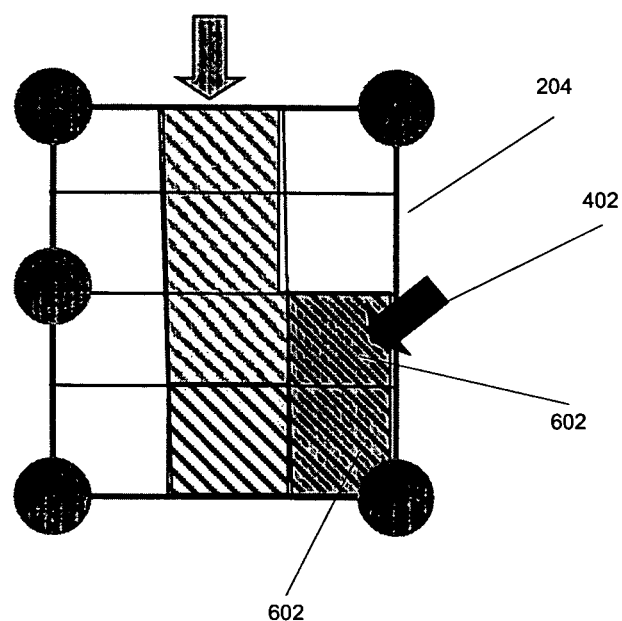
FIG. 6 depicts a combination of the channels shown in FIGS. 4 and 5.

FIG. 6 represents the shaded areas FIG. 4 overlayed on the shaded areas of FIG. 5. The intersection of FIGS. 4 and 5 identifies areas 602, in a gross sense, within the tile in which vias would be allowed.

Figure 7:
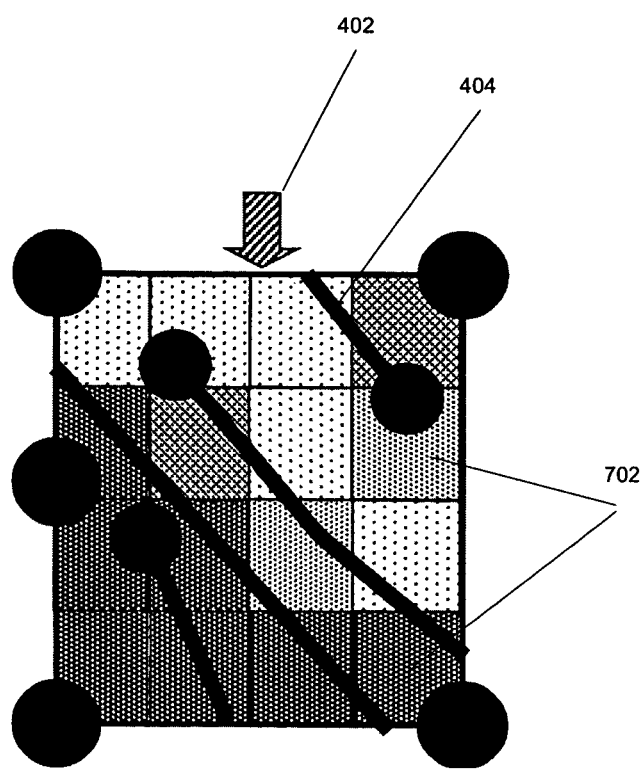
FIG. 7 depicts a 4×4 grid showing proposed channels superimposed on a tile.

FIG. 7 represents a similar tile to those shown in FIGS. 4, 5 and 6. However, in the alternate embodiment shown in FIG. 7, the tile has been divided into a 4×4 grid having 16 segments 702. In the embodiment, for the identified channel 402 each segment is shown, through shading, as having one of four values associated with the viability of reaching that segment 702—zero, small, large and infinity—zero being most viable and infinity representing impossibility. In FIG. 7 this is represented graphically by intensity of shading. Each of the four values (zero, small, large and infinity) can be represented by a 2-bit value. As there are 16 segments 702 within the tile 202, the entire tile 202 can be represented by a 32-bit value which identifies the relative viability of reaching each of the 16 segments 702 within the tile 202. This 32-bit value is referred to as channel data.

In some embodiments, two 32-bit values, one representing a first layer and the second representing a second layer, each having the same tile edges, can be compared to determine the segments 702 within a tile in which a via would be most viable. This identified location is referred to as the $1^{st}$ order via location.

In some embodiments, during wavefront expansion after the segments 702 are further divided into triangles 302, probes are created from each face 308 to its two neighbor faces 308. This expansion process for a single layer supports triangle-based, topological single-layer path selection. In alternate embodiments, division of the segments 702 can occur after wavefront expansion and identification of the segments 702 that are most appropriate for via are identified.

Figure 8:
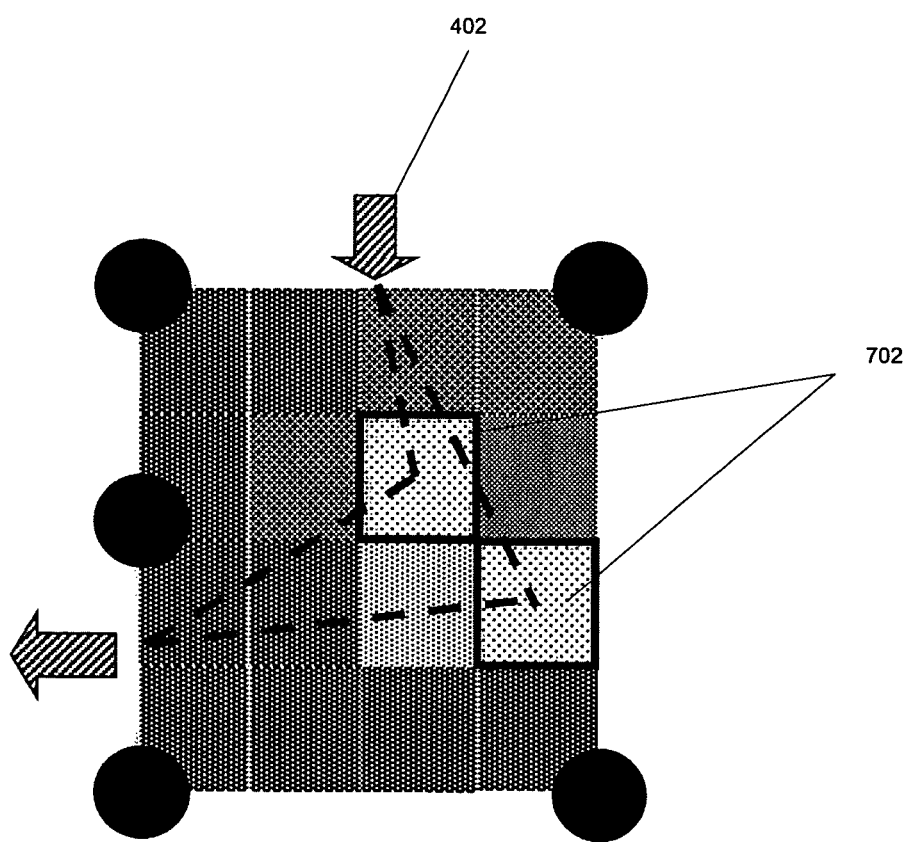
FIG. 8 depicts a 4×4 grid showing proposed paths across a tile

FIG. 8 depicts a 4×4 grid showing proposed paths across a tile. The paths are defined by the cross point of the channel over the edges of the tile and the internal segments within the tile. One proposed path runs from a point on the first edge of the tile, to a first segment within the tile and terminates at a point on the second edge of the tile. The second proposed path runs from a point on the first edge of the tile, to a second segment within the tile and terminates at a point on the second edge of the tile.

Figure 9:
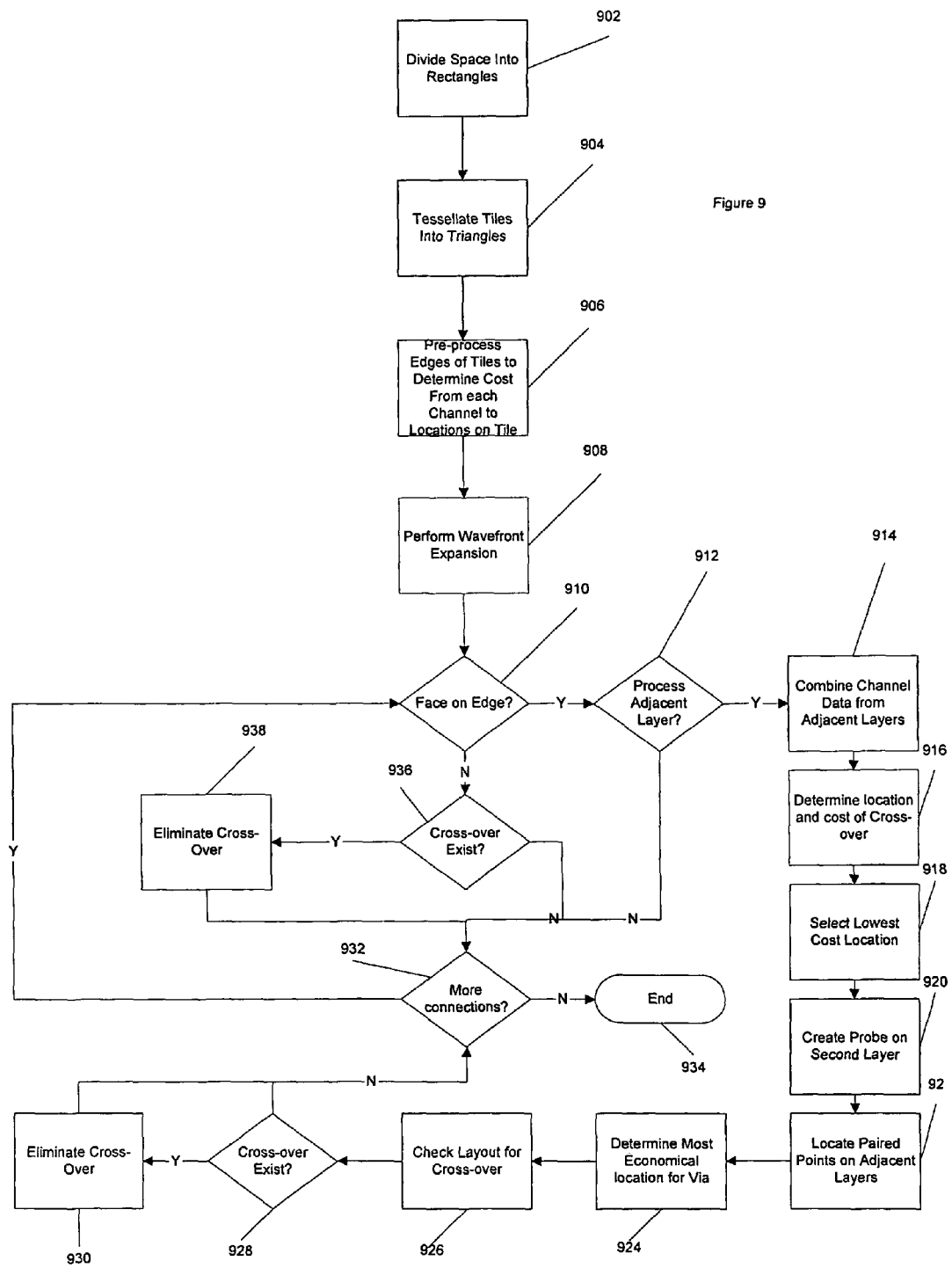
FIG. 9 depicts a flow diagram of a method for PCB routing.

FIG. 9 depicts a flow diagram 900 of a method for PCB routing. In step 902 the routing space is divided into rectangular tiles 202. The division of the routing space into tiles 202 can be performed using any known and or convenient method or system.

In step 904, the tiles 202 are further divided into triangles 302. In some embodiments, nodes 304 to generate the triangles 302 can be introduced at locations where no objects currently exist or nodes 304 can be selected to be coincident with objects. In some embodiments, nodes are selected to control the geometry of the triangles 302. However, in alternate embodiments, such geometric control of the triangles 302 may not be imposed.

In step 906, the edges 204 of each tile are pre-processed to determine a relative viability of each channel across a tile 202. This pre-processing can be performed using the manner described above with regards to FIGS. 4-6 and/or using any known and/or convenient method or system.

In step 908, wavefront expansion is performed to initiate global routing. Wavefront expansion can be performed using any known and/or convenient method or system which will allow identification of appropriate connection paths.

In step 910, an evaluation is made to determine if a face 308 is coincident with an edge 204 on a given tile 202. If it is determined that a face 308 is coincident with an edge 204, then an evaluation will be made in step 912 regarding whether adjacent layers should be processed to determine if a via is appropriate. This determination can be based on any factors selected and/or specified by a designer and/or based on whether the desired connection path of the specific channel is possible within a given layer without cross-over. In alternate embodiment, any factors selected by the designer can be used to make this determination.

If, in step 912, it is determined that evaluation of adjacent layers is appropriate, then, in step 914, the channel data from the adjacent layer is combined with the channel data from the current layer. In step 916, the combination of the channel data is evaluated and the viability of segments within the tile is determined. This determination can be performed using the method described with regards to FIGS. 4-6 or by using any known and/or convenient method.

In step 918, the segment having the greatest viability or lowest cost is selected and a probe in the triangulated space is created on the second layer in step 920. The probe starts by invoking the 1$^{st}$ Order Via Location as its initial guess.

In step 922, the system locates pairs of points on adjacent layers which would be appropriate for vias. In one embodiment, the system can do this by selecting eight candidate locations near that initial guess. These eight points are the points to the North, Northwest, West, Southwest, South, Southeast, East and Northeast of the original guess. It computes a score for each of these locations and selects the best of the nine locations—the original is also considered. It then selects eight more locations, computes their score, and selects the best. This process continues until no better candidates are found.

In step 924, the most economical location for the via is located. To compute the score for reaching a candidate location, the following algorithm is performed: The triangles between the source Channel and the candidate location are traversed. Each of the Wires scheduled to pass through these triangles is processed. Even though Wires have not yet been created, the Cuts know which Wires are scheduled to pass through them. For each of the potential Wires, the algorithm computes the added length that would be needed to go around the candidate via location. A cost is computed for this additional location. This cost takes into account the fact that when the Wire is actually created this additional distance might cause the Wire to approach the maximum length rule for that Wire. If this additional distance would cause the Wire to exceed its rule, then infinity is used as the cost. In one embodiment, infinity is simply a very large number. The sum of all of the costs for all of the affected Wires is the cost for that candidate via location.

In step 926, the new proposed layout is examined to determine if any crossovers have been created by the insertion of the new via. This examination in step 926 can use any known and/or convenient method or system. If in step 928, it is determined that a crossover exists, any known and/or convenient crossover costing methods can be implemented to avoid the crossover.

If no crossovers are determined to exist or once the crossovers have been costed in step 930, the system will determine if further evaluation is necessary to make the required routing connections. This evaluation can be made using any known and/or convenient method or system. If the system determines that no further evaluation is necessary, the system can finalize the layout in an end operation 934. However, if additional evaluation is appropriate, the system can return to step 910 and locate additional face/edge coincidences.

Returning to step 912. If the determination is made not to process adjacent layers, the system can advance to step 932 and determine if additional evaluation of the system is necessary and take action as described above.

Returning to step 910. If in step 910 a determination is made that there are no face/edge coincidences the system can advance to step 936. In step 936 a determination is made as to whether a crossover exists within the tile 202. If a crossover is determined to exist within the tile 202, the system can advance to step 938 and any known and/or convenient crossover costing system or method can be invoked to avoid the crossover. After the crossover is avoided or if no crossover is determined to exist within the tile, at step 936, the system can advance to step 932 and determine whether additional evaluation is necessary and advance as described above.

Figure 10:
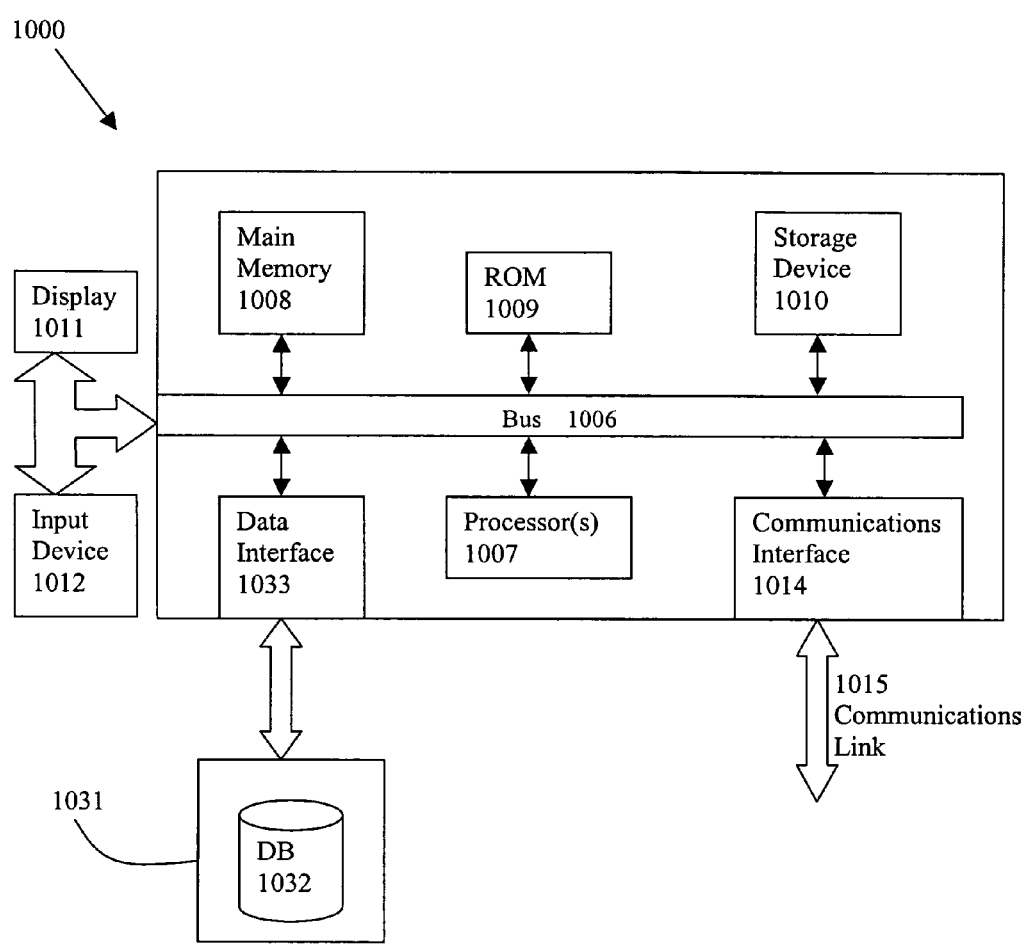
FIG. 10 depicts a computerized system on which a method for PCB routing can be implemented.

With reference to FIG. 10, the execution of the sequences of instructions required to practice the embodiments may be performed by a computer system 1000 as shown in FIG. 10. In an embodiment, execution of the sequences of instructions is performed by a single computer system 1000. According to other embodiments, two or more computer systems 1000 coupled by a communication link 1015 may perform the sequence of instructions in coordination with one another. Although a description of only one computer system 1000 will be presented below, however, it should be understood that any number of computer systems 1000 may be employed to practice the embodiments.

A computer system 1000 according to an embodiment will now be described with reference to FIG. 10, which is a block diagram of the functional components of a computer system 1000. As used herein, the term computer system 1000 is broadly used to describe any computing device that can store and independently run one or more programs.

Each computer system 1000 may include a communication interface 1014 coupled to the bus 1006. The communication interface 1014 provides two-way communication between computer systems 1000. The communication interface 1014 of a respective computer system 1000 transmits and receives electrical, electromagnetic or optical signals, that include data streams representing various types of signal information, e.g., instructions, messages and data. A communication link 1015 links one computer system 1000 with another computer system 1000. For example, the communication link 1015 may be a LAN, in which case the communication interface 1014 may be a LAN card, or the communication link 1015 may be a PSTN, in which case the communication interface 1014 may be an integrated services digital network (ISDN) card or a modem, or the communication link 1015 may be the Internet, in which case the communication interface 1014 may be a dial-up, cable or wireless modem.

A computer system 1000 may transmit and receive messages, data, and instructions, including program, i.e., application, code, through its respective communication link 1015 and communication interface 1014. Received program code may be executed by the respective processor(s) 1007 as it is received, and/or stored in the storage device 1010, or other associated non-volatile media, for later execution.

In an embodiment, the computer system 1000 operates in conjunction with a data storage system 1031, e.g., a data storage system 1031 that contains a database 1032 that is readily accessible by the computer system 1000. The computer system 1000 communicates with the data storage system 1031 through a data interface 1033. A data interface 1033, which is coupled to the bus 1006, transmits and receives electrical, electromagnetic or optical signals, that include data streams representing various types of signal information, e.g., instructions, messages and data. In embodiments, the functions of the data interface 1033 may be performed by the communication interface 1014.

Computer system 1000 includes a bus 1006 or other communication mechanism for communicating instructions, messages and data, collectively, information, and one or more processors 1007 coupled with the bus 1006 for processing information. Computer system 1000 also includes a main memory 1008, such as a random access memory (RAM) or other dynamic storage device, coupled to the bus 1006 for storing dynamic data and instructions to be executed by the processor(s) 1007. The main memory 1008 also may be used for storing temporary data, i.e., variables, or other intermediate information during execution of instructions by the processor(s) 1007.

The computer system 1000 may further include a read only memory (ROM) 1009 or other static storage device coupled to the bus 1006 for storing static data and instructions for the processor(s) 1007. A storage device 1010, such as a magnetic disk or optical disk, may also be provided and coupled to the bus 1006 for storing data and instructions for the processor(s) 1007.

A computer system 1000 may be coupled via the bus 1006 to a display device 1011, such as, but not limited to, a cathode ray tube (CRT), for displaying information to a user. An input device 1012, e.g., alphanumeric and other keys, is coupled to the bus 1006 for communicating information and command selections to the processor(s) 1007.

According to one embodiment, an individual computer system 1000 performs specific operations by their respective processor(s) 1007 executing one or more sequences of one or more instructions contained in the main memory 1008. Such instructions may be read into the main memory 1008 from another computer-usable medium, such as the ROM 1009 or the storage device 1010. Execution of the sequences of instructions contained in the main memory 1008 causes the processor(s) 1007 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1007. Such a medium may take many forms, including, but not limited to, non-volatile, volatile and transmission media. Non-volatile media, i.e., media that can retain information in the absence of power, includes the ROM 1009, CD ROM, magnetic tape, and magnetic discs. Volatile media, i.e., media that can not retain information in the absence of power, includes the main memory 1008. Transmission media includes coaxial cables, copper wire and fiber optics, including the wires that comprise the bus 1006. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A computer implemented method for determining routing paths of an electronic circuit design, comprising:
    prior to initiating detail routing of the electronic circuit design, using at least one processor to perform at least a process, the process comprising:
        determining relative viability of channel routing, in which
            the channel routing routes a wire via a channel, which is on an edge shared between two of a plurality of rectangular tiles in a routing space, and
            the relative viability of channel routing indicates a likelihood of routing the wire to a plurality of first locations in the routing space through the channel;
        identifying a generalized routing path within at least one of the plurality of rectangular tiles based at least in part upon the relative viability of the channel routing; and
        identifying a location of a via in a plurality of triangular regions of the at least one of the plurality of rectangular tiles in a layer based at least in part upon the channel data and the generalized routing path by performing wavefront expansion and creating a probe from a face to a neighboring face of the face in the plurality of triangular regions during the wavefront expansion, wherein the action of identifying the location of the via comprises:

determining a first via location in the layer for the via; and determining the location for the via in the layer based at least in part upon the first via location prior to initiating the detail routing.

2. The method of claim 1, further comprising determining channel data comprising viability data of each segment for routing a wire from one or more channels to various locations in the routing space.

3. The method of claim 2, further comprising determining one or more via locations based in part upon the channel data.

4. The method of claim 1, further comprising eliminating one or more crossovers.

5. The method of claim 1, in which a location of a node of the plurality of triangular regions coincides with an object comprising a via or a pad.

6. The method of claim 1, further comprising determining channel data for one or more adjacent layers to determine whether a via is appropriate for one or more additional connections.

7. The method of claim 6, further comprising combining channel data of the current layer and the one or more adjacent layers.

8. The method of claim 7, further comprising determining the viability of reaching one or more defined locations on the current or the one or more adjacent layers based in part on combined channel data.

9. The method of claim 8, further comprising determining paired points appropriate for one or more vias on the current and the one or more adjacent layers based in part on one or more criteria.

10. The method of claim 9, in which the act of determining the paired points comprises:
identifying a first candidate via location;
determining a first score for reaching a candidate location for the initial candidate via location;
identifying one or more additional candidate via locations near the initial candidate via location;
determining one or more additional scores for reaching the candidate location for each of the one or more additional candidate via locations; and
locating at least one via location based in part on the scores of the first candidate via location and the one or more additional candidate via locations.

11. The method of claim 10, further comprising an iterative process.

12. The method of claim 10, in which the first candidate via location is a first order via location, in which the first order via location represents an approximate via location.

13. The method of claim 10, in which the first score and the one or more additional scores comprise one or more additional lengths for a potential wire to go around the via location.

14. The method of claim 1 in which the plurality of triangular regions on a first layer of an electronic design are different from the plurality of or a second plurality of triangular regions on a second layer of the electronic design.

15. The method of claim 1, further comprising:
determining a first order via location based upon the relative viability of channel routing and the generalized routing paths, in which the act of determining the first order via location is performed prior to creation of detail wires, and the first order via location represents an approximate via location.

16. The method of claim 15, further comprising:
determining a second order via location based upon the plurality of triangular regions and a score for at least one of a plurality of candidate via locations in a vicinity of the first order via location, wherein the second order via location is a more accurate via location than the first order via location.

17. The method of claim 15, in which the act of determining relative viability of channel routing comprises identifying a data value representing a possibility of running a conductor from a channel on an edge of the at least one of the one or more rectangular tiles to at least one predetermined location within the first tile.

18. The method of claim 17, further comprising:
identifying a second tile on a second layer of the electronic circuit design, in which the second tile corresponds to the at least one of the one or more rectangular tiles on a first layer;
subdividing the second tile into a first number of rectangular segments; and
determining a second relative viability of channel routing for the second tile by identifying a second data value representing a possibility of running a conductor from a channel on an edge of the second tile to each of the first number of rectangular segments of the second tile.

19. The method of claim 18, in which the act of determining a first order via location comprises:
identifying a composite relative viability of channel routing for the first and the second tile by comparing the relative viability of the first tile to the second relative viability of the second tile.

20. The method of claim 19, in which the act of determining a first order location is further based upon the composite relative viability of channel routing for the first and the second tile.

21. A computer program product comprising a non-transitory computer-usable storage medium having executable code which, when executed by a processor, causes the processor to execute a process for determining routing paths, the process comprising:
prior to initiating detail routing of the electronic circuit design, using at least one processor to perform at least a process, the process comprising:
determining relative viability of channel routing, in which the channel routing routes a wire via a channel which is on an edge shared between two of a plurality of rectangular tiles in a routing space, and the relative viability of channel routing indicates a likelihood of routing the wire to a plurality of first locations in the routing space through the channel;
identifying a generalized routing path within at least one of the plurality of rectangular tiles based at least in part upon the relative viability of the channel routing; and
identifying a location of a via in a plurality of triangular regions of the at least one of the plurality of rectangular tiles in a layer based at least in part upon the channel data and the generalized routing path by performing wavefront expansion and creating a probe from a face to a neighboring face of the face in the plurality of triangular regions during the wavefront expansion, wherein the action of identifying the location of the via comprises:
determining a first via location in the layer for the via; and
determining the location for the via in the layer based at least in part upon the first via location prior to initiating the detail routing.

22. The computer program product of claim 21, in which the process further comprises determining channel data comprising viability data of each segment for routing a wire from one or more channels to various locations in the routing space.

23. The computer program product of claim 22, in which the process comprises determining one or more via locations based upon the channel data.

24. The computer program product of claim 21, further comprising determining channel data for one or more adjacent layers to determine whether a via is appropriate for one or more additional connections.

25. The computer program product of claim 24, in which the process further comprises combining channel data of the current layer and the one or more adjacent layers.

26. The computer program product of claim 25, in which the process further comprises determining the viability of reaching one or more defined locations on the current or the one or more adjacent layers based in part on combined channel data.

27. The computer program product of claim 26, in which the process further comprises determining paired points appropriate for one or more vias on the current and the one or more adjacent layers based in part on one or more criteria.

28. The computer program product of claim 27, in which the act of determining the paired points comprises:
  identifying a first candidate via location;
  determining a score for reaching a candidate location for the initial candidate via location;
  identifying one or more additional candidate via locations near the initial candidate via location;
  determining one or more additional scores for reaching the candidate location for each of the one or more additional candidate via locations; and
  locating at least one via location based in part on the scores of the first candidate via location and the one or more additional candidate via locations.

29. The computer program product of claim 28, in which the act of determining the paired points further comprises an iterative process.

30. The computer program product of claim 28, in which the first candidate via location is a first order via location, in which the first order via location represents an approximate via location.

31. The computer program product of claim 28, in which the first score and the one or more additional scores comprise one or more additional lengths for a potential wire to go around the via location.

32. The computer program product of claim 21 in which the plurality of triangular regions on a first layer of an electronic design are different from the plurality of or a second plurality of triangular regions on a second layer of the electronic design.

33. A computer system, comprising:
  at least one processor, prior to initiating detail routing of the electronic circuit design, that is to:
    determine relative viability of channel routing, in which the channel routing routes a wire via a channel which is on an edge shared between two of a plurality of rectangular tiles in a routing space, wherein the relative viability of channel routing indicates a likelihood of routing the wire to a plurality of first locations in a routing space through the channel;
    identify a generalized routing path within at least one of the plurality of rectangular tiles based at least in part upon the relative viability of the channel routing; and
    identify a location of a via in a plurality of triangular regions of the at least one of the plurality of rectangular tiles in a layer based at least in part upon the channel data and the generalized routing path by performing wavefront expansion and creating a probe from a face to a neighboring face of the face in the plurality of triangular regions during the wavefront expansion, wherein the at least one processor that is to identify the location of the via is further to:
      determine a first via location in the layer for the via; and
      determine the location for the via in the layer based at least in part upon the first via location prior to initiating the detail routing.

34. The system of claim 33, the at least one processor is further to determine channel data comprising viability data of each segment for routing a wire from one or more channels to various locations in the routing space.

35. The system of claim 34, the at least one processor further to determine one or more via locations based upon the channel data.

36. The system of claim 33, the at least one processor further to determine channel data for one or more adjacent layers to determine whether a via is appropriate for one or more additional connections.

37. The system of claim 36, the at least one processor further to combine channel data of the current layer and the one or more adjacent layers.

38. The system of claim 37, the at least one processor further to determine the viability of reaching one or more defined locations on the current or the one or more adjacent layers based in part on combined channel data.

39. The system of claim 38, the at least one processor further to determine paired points appropriate for one or more vias on the current and the one or more adjacent layers based in part on one or more criteria.

40. The system of claim 39, in which the at least one processor to determine the paired points is further to:
  identify a first candidate via location;
  determine a score for reaching a candidate location for the initial candidate via location;
  identify one or more additional candidate via locations near the initial candidate via location;
  determine one or more additional scores for reaching the candidate location for each of the one or more additional candidate via locations; and
  locate at least one via location based in part on the scores of the first candidate via location and the one or more additional candidate via locations.

41. The system of claim 40, in which the at least one processor to determine the paired points is further to execute an iterative process.

42. The computer system of claim 33 in which the plurality of triangular regions on a first layer of an electronic design are different from the plurality of or a second plurality of triangular regions on a second layer of the electronic design.

* * * * *